(12) United States Patent
Wang et al.

(10) Patent No.: US 10,453,803 B2
(45) Date of Patent: Oct. 22, 2019

(54) WIRING SUBSTRATE HAVING ALTERNATING GROUND AND SIGNAL LINES IN A PLURALITY OF WIRING LAYERS

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ming-Hsuan Wang, Hsinchu (TW); Ting-Hao Wang, Hsinchu (TW); Yen-Chih Chiu, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/800,049

(22) Filed: Oct. 31, 2017

(65) Prior Publication Data

US 2018/0366416 A1  Dec. 20, 2018

(30) Foreign Application Priority Data

Jun. 14, 2017 (CN) .......................... 2017 1 0445647

(51) Int. Cl.
*H01L 23/12* (2006.01)
*H01L 23/48* (2006.01)
(Continued)

(52) U.S. Cl.
CPC ........ *H01L 23/552* (2013.01); *H01L 23/5383* (2013.01); *H01L 23/5386* (2013.01);
(Continued)

(58) Field of Classification Search
CPC ............... H01L 23/552; H01L 23/5383; H01L 23/5386; H01L 23/5286; H01L 24/16; H01L 23/49827
See application file for complete search history.

(56) References Cited

U.S. PATENT DOCUMENTS 6,700,076 B2 * 3/2004 Sun ........................ H01L 21/486
174/262
8,803,320 B2 * 8/2014 Chen .................... H01L 23/5225
257/662

(Continued)

FOREIGN PATENT DOCUMENTS

TW    200950609 A    12/2009
TW    201639113 A    11/2016

*Primary Examiner* — Alonzo Chambliss
(74) *Attorney, Agent, or Firm* — CKC & Partners Co., LLC (57) ABSTRACT

A semiconductor wiring substrate includes a first wiring layer, a second wiring layer stacked on the first wiring layer, and a dielectric layer sandwiched between the first wiring layer and the second wiring layer. The first wiring layer includes first signal lines and first grounding lines which are interleaved and spaced apart in the first wiring layer. The second wiring layer includes second signal lines and second grounding lines which are interleaved and spaced apart in the second wiring layer. An orthographic projection of one of the second signal lines to the first wiring layer is located between each two adjacent ones of the first signal lines.

18 Claims, 8 Drawing Sheets

(51) Int. Cl.
  *H01L 21/00*     (2006.01)
  *H01L 21/4763*   (2006.01)
  *H01L 23/552*    (2006.01)
  *H01L 23/00*     (2006.01)
  *H01L 23/538*    (2006.01)

(52) U.S. Cl.
  CPC .... *H01L 24/16* (2013.01); *H01L 2224/16227* (2013.01); *H01L 2924/15192* (2013.01); *H01L 2924/15311* (2013.01)

(56) References Cited

U.S. PATENT DOCUMENTS

2003/0051910 A1* 3/2003 Dyke ................ H01L 23/49822
  174/262
2011/0037528 A1* 2/2011 Guo ................ H01L 23/49822
  333/1
2014/0117552 A1* 5/2014 Qian ................ H01L 23/49827
  257/762

\* cited by examiner

WIRING SUBSTRATE HAVING ALTERNATING GROUND AND SIGNAL LINES IN A PLURALITY OF WIRING LAYERS

RELATED APPLICATIONS

This application claims priority to China Application Serial Number 201710445647.9, filed Jun. 14, 2017, which is herein incorporated by reference.

BACKGROUND

Field of Disclosure

The present disclosure relates to a wiring substrate. More particularly, the present disclosure relates to a semiconductor wiring substrate and a semiconductor package device.

Description of Related Art

In recent years, with quick development of advanced process, integrated circuit (IC) design becomes more sophisticated. As conventional packaging method is primarily two-dimensional (2D), it is insufficient to meet the existing packaging needs for large and high speed design. As a result, "two and a half dimensional" (2.5D) integrated circuit stacking technology and three-dimensional (3D) integrated circuit stacking technology are developed from the semiconductor industry.

Exemplarily, the 2.5D integrated circuit is characterized by respectively stacking chips having different functions or properties onto a silicon interposer. The stacked chips are electrically connected to each other through inner wiring and through-silicon via (TSV) of the silicon interposer.

However, designs that utilized silicon interposer usually require very dense wirings. Therefore, difficult performance target, namely speed, crosstalk and signal loss, compounded with high manufacturing cost of interposer become the main challenges.

SUMMARY

One embodiment of the disclosure is to provide a semiconductor package device and its semiconductor wiring substrate to resolve the aforementioned inconvenience and deficiencies, thereby not only improving signal transmission performances and reducing manufacturing costs, but also reducing signal loss and crosstalk.

In one embodiment of the disclosure, a semiconductor wiring substrate includes an upper contact layer, a lower contact layer, a first wiring layer, a second wiring layer and a first dielectric layer. The lower contact layer is electrically connected to the upper contact layer. The first wiring layer is disposed between the upper contact layer and the lower contact layer, and electrically connected to the upper contact layer and the lower contact layer. The first wiring layer includes a plurality of first signal lines and a plurality of first grounding lines which are interleaved and spaced apart in the first wiring layer. The second wiring layer is stacked on one side of the first wiring layer. The second wiring layer includes a plurality of second signal lines and a plurality of second grounding lines which are interleaved and spaced apart in the second wiring layer. One of the second signal lines is located between two adjacent ones of the first signal lines, creating an orthogonal projection on to the first wiring layer. The dielectric layer is sandwiched between the first wiring layer and the second wiring layer.

In one embodiment of the disclosure, a semiconductor wiring substrate includes a main grounding area, a first wiring layer, a second wiring layer, a dielectric layer and at least one shielding structure. The first wiring layer includes a plurality of first signal lines. The second wiring layer is stacked on one side of the first wiring layer, and includes a plurality of second signal lines. The dielectric layer is sandwiched between the first wiring layer and the second wiring layer. The shielding structure is electrically connected to the main ground area. The shielding structure periodically alternates in the first wiring layer, the dielectric layer and the second wiring layer. The shielding structure is disposed between one of the first signal lines and one of the second signal lines which are adjacent to each other. Thus, the shielding structure shields signals between the first signal lines and the second signal lines.

Another embodiment of the disclosure is to provide a semiconductor package device. The semiconductor package device includes at least one semiconductor chip, a package substrate and an interposer having the aforementioned semiconductor wiring substrate which is interposed between the semiconductor chip and the package substrate.

As what is disclosed above, comparing to the conventional arts, the solution provided by the present disclosure has advantages and beneficial effects. With the aforementioned solution, the technical improvement and practicability are provided and can be widely applied in the relative industries, wherein the solution provided by the present disclosure at least has the following advantages:

1. the wiring routability in each of layers of the semiconductor wiring substrate is maximized thereby improving surface contact quantity;

2. the possibilities of signal loss and signal crosstalk are reduced; and 3. the layer number of the semiconductor wiring substrate in the conventional design is reduced wiring substrate so as to further reducing manufacturing costs.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

Figure 1:
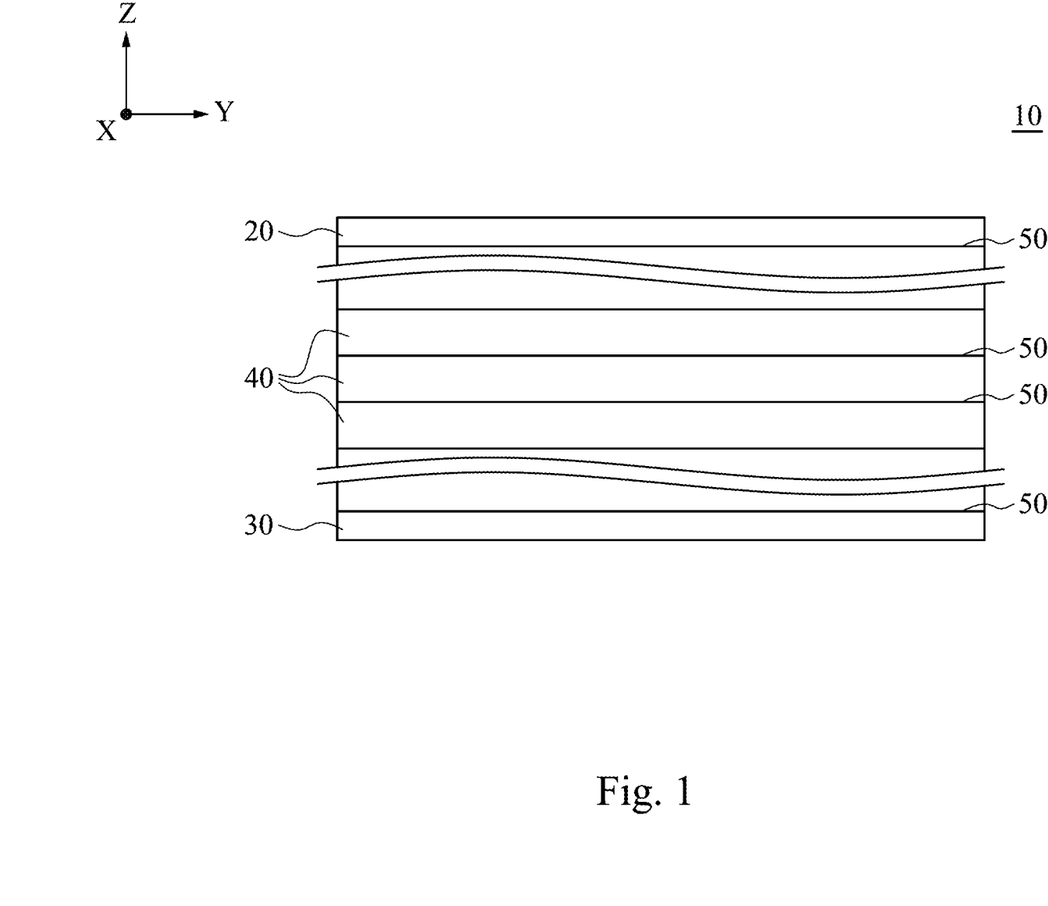
FIG. 1 is a partial cross-sectional view of a semiconductor wiring substrate according to one embodiment of the disclosure.

Reference is now made to FIG. 1, in which FIG. 1 is a partial sectional view of a semiconductor wiring substrate 10 according to one embodiment of the disclosure. As shown in FIG. 1, in the embodiment, the semiconductor wiring substrate 10 includes an upper contact layer 20, a lower contact layer 30, a plurality of wiring layers 40 and a plurality of dielectric layers 50. The lower contact layer 30 is electrically connected to the upper contact layer 20 through these wiring layers 40. The upper contact layer 20 and the lower contact layer 30 are respectively disposed on two opposite sides of the semiconductor wiring substrate 10. These wiring layers 40 are sandwiched between the upper contact layer 20 and the lower contact layer 30, and electrically connected to the upper contact layer 20 and the lower contact layer 30. One of the dielectric layers 50 is sandwiched between the upper contact layer 20 and one of the wiring layers 40 most adjacent to the upper contact layer 20. Another of the dielectric layers 50 is sandwiched between the lower contact layer 30 and another wiring layer 40 most adjacent to the lower contact layer 30. Each of the other dielectric layers 50 is sandwiched between each two adjacent ones of the wiring layers 40. In the embodiment, since signal lines (e.g., voltage signals or data signals) are arranged so that any two adjacent wiring layers 40 do not overlapped with each other in the vertical direction (e.g., Z-axis), the gap between the signal lines in the two adjacent wiring layers 40 can be increased so that impedance between the signal lines and transmission speed of the signal lines will not be reduced thereby mitigating the effect of signal loss and crosstalk.

For easily identifying signal lines and grounding lines in the figures referred hereinafter, each signal line of each of the wiring layers is labelled as "S" and each grounding line of each of the wiring layers is labelled as "G" as simple identifications.

Figure 2A:
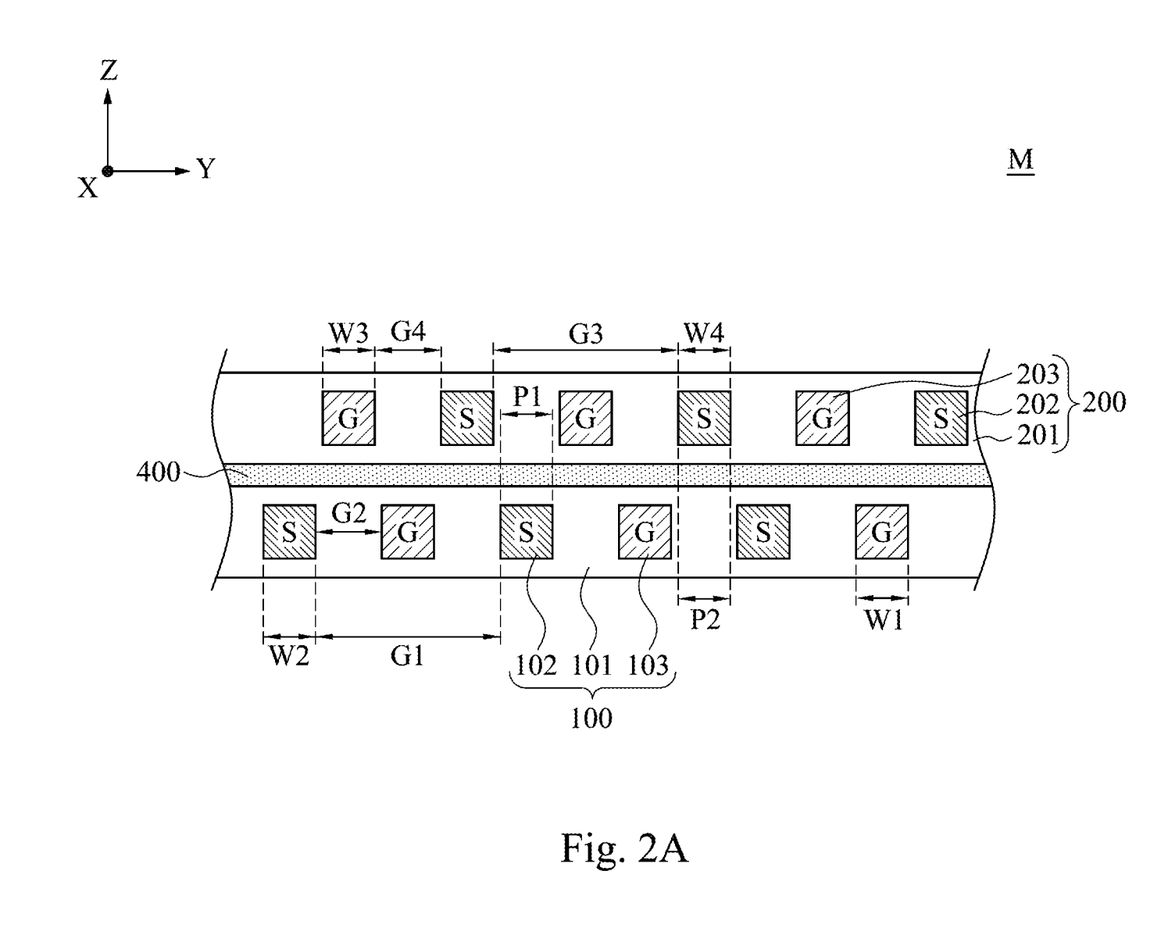
FIG. 2A is a partial schematic view of several wiring layers of a semiconductor wiring substrate according to one embodiment of the disclosure.

FIG. 2A is a partial schematic view of several wiring layers 100-200 of a semiconductor wiring substrate 10 according to one embodiment of the disclosure. Specifically, as shown in FIG. 2A, the semiconductor wiring substrate 10 includes a multilayer structure M. The multilayer structure M is sandwiched between the upper contact layer 20 and the lower contact layer 30 (FIG. 1), and electrically connected to the upper contact layer 20 and the lower contact layer 30. The multilayer structure M includes a first wiring layer 100, a second wiring layer 200 and a first dielectric layer 400. The first wiring layer 100 and the second wiring layer 200 are stacked together in a stacking direction (e.g., Z-axis). The first wiring layer 100 is stacked on one side of the second wiring layer 200, and the first dielectric layer 400 is sandwiched between the first wiring layer 100 and the second wiring layer 200.

In the embodiment, more specifically, the first wiring layer 100 includes a first layer body 101, a plurality of first signal lines 102 and a plurality of first grounding lines 103. The first layer body 101 is placed on a plane (e.g., X-Y plane), and the first signal lines 102 and the first grounding lines 103 are routed in the first layer body 101. The plane (e.g., X-Y plane) and the aforementioned stacking direction are orthogonal or approximately orthogonal to each other.

Specifically, the first signal lines 102 and the first grounding lines 103 are interleaved and spaced apart in the first layer body 101. Exemplarily, the first signal lines 102 and the first grounding lines 103 are alternately arranged in the first layer body 101 with a quantity correspondingly in a ratio of one to one. That is, only single one of the first grounding lines 103 is located between any two adjacent ones of the first signal lines 102 in the same first wiring layer 100. Thus, a gap G1 defined between any two adjacent ones of the first signal lines 102 is greater than a gap G2 defined between each of the first signal lines 102 and each of the first grounding lines 103 which are adjacent to each other. Also, a line width W1 of each one or at least one of the first grounding lines 103 is equal to a line width W2 of each one or at least one of the first signal lines 102, so as to easily control the gap G1 between any two adjacent ones of the first signal lines 102. For example, but not be limited thereto, the aforementioned line widths W1, W2 are in a range of 0.5μ-10μ, respectively. Furthermore, a cross-sectional area of each one or at least one of the first grounding lines 103 is equal to a cross-sectional area of each one or at least one of the first signal lines 102. However, the disclosure is not limited to that the line width of the first grounding line must be equal to the line width of the first signal line. The second wiring layer 200 includes a second layer body 201, a plurality of second signal lines 202 and a plurality of second grounding lines 203. The second layer body 201 is placed on another plane (e.g., X-Y plane), and the second signal lines 202 and the second grounding lines 203 are routed in the second layer body 201. The other plane (e.g., X-Y plane) and the aforementioned stacking direction are orthogonal or approximately orthogonal to each other.

Specifically, the second signal lines 202 and the second grounding lines 203 are interleaved and spaced apart in the second layer body 201. Exemplarily, the second signal lines 202 and the second grounding lines 203 are alternately arranged in the second layer body 201 with a quantity correspondingly in a ratio of one to one. That is, only single one of the second grounding lines 203 is located between any two adjacent ones of the second signal lines 202 in the same second wiring layer 200.

Thus, a gap G3 defined between any two adjacent ones of the second signal lines 202 is greater than a gap G4 defined between each of the second signal lines 202 and each of the second grounding lines 203 which are adjacent to each other. Also, a line width W3 of each one or at least one of the second grounding lines 203 is equal to the line width W4 of each one or at least one of the second signal lines 202, so as to easily control the gap G3 defined between any two adjacent ones of the second signal lines 202. For example, but not be limited thereto, the aforementioned line widths W3, W4 are in a range of 0.5μ-10μ, respectively. Furthermore, a cross-sectional area of each one or at least one of the second grounding lines 203 is equal to a cross-sectional area of each one or at least one of the second signal lines 202.

However, the disclosure is not limited to that the line width of the second grounding line must be equal to the line width of the second signal line.

As shown in FIG. 2A, the second signal lines 202 and the first signal lines 102 do not overlap one another. That is, an orthogonal projection P1 of each of the first signal lines 102 onto the second wiring layer 200 is located between each two adjacent ones of the second signal lines 202, rather than overlapped with each of the second signal lines 202. An orthogonal projection P2 of each of the second signal lines 202 to the first wiring layer 100 is located between each two adjacent ones of the first signal lines 102, rather than overlapped with each of the first signal lines 102. Therefore, signal loss and signal crosstalk will be minimized on the first signal lines 102 and the second signal lines 202 because of the spacing and the non-overlapping structure.

Figure 2B:
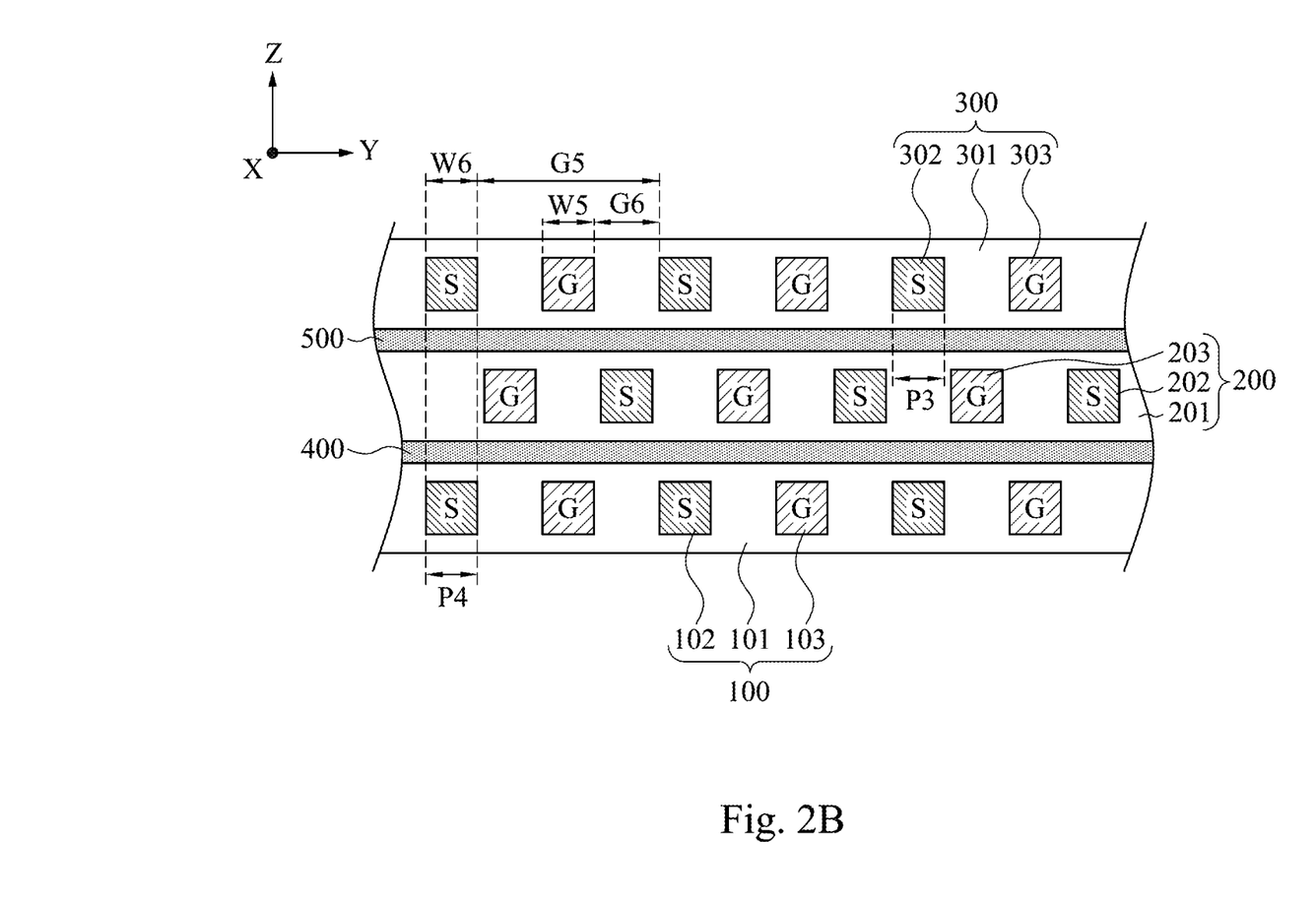
FIG. 2B is a partial schematic view of several wiring layers of a semiconductor wiring substrate according to one embodiment of the disclosure.

FIG. 2B is a partial schematic view of several wiring layers 100-300 of a semiconductor wiring substrate according to one embodiment of the disclosure. As shown in FIG. 2B, the multilayer structure M of FIG. 2B is similar to the multilayer structure M of FIG. 2A, except that the multilayer structure M of FIG. 2B further includes a third wiring layer 300 and a second dielectric layer 500. The first wiring layer 100, the second wiring layer 200 and the third wiring layer 300 are stacked together in the aforementioned stacking direction (e.g., Z-axis). The second wiring layer 200 is disposed between the third wiring layer 300 and the first wiring layer 100, and the second dielectric layer 500 is sandwiched between the second wiring layer 200 and the third wiring layer 300.

In the embodiment, more specifically, the third wiring layer 300 includes a third layer body 301, a plurality of third signal lines 302 and a plurality of third grounding lines 303. The third layer body 301 is placed on one another plane (e.g., X-Y plane), and the third signal lines 302 and the third grounding lines 303 are routed in the third layer body 301. The plane (e.g., X-Y plane) and the aforementioned stacking direction are orthogonal or approximately orthogonal to each other. Specifically, the third signal lines 302 and the third grounding lines 303 are interleaved and spaced apart in the third layer body 301. Exemplarily, the third signal lines 302 and the third grounding lines 303 are alternately arranged in the third layer body 301 with a quantity correspondingly in a ratio of one to one. That is, only single one of the third grounding lines 303 is located between any two adjacent ones of the third signal lines 302 in the same third wiring layer 300. Thus, a gap G5 between any two adjacent ones of the third signal lines 302 is greater than a gap G6 defined between each of the third signal lines 302 and each of the third grounding lines 303 which are adjacent to each other. Also, a line width W5 of each one or at least one of the third grounding lines 303 is equal to a line width W6 of each one or at least one of the third signal lines 302, so as to easily control the gap G5 between any two adjacent ones of the third signal lines 302. For example, but not be limited thereto, the aforementioned line widths W5, W6 are in a range of 0.5µ-10µ, respectively. Furthermore, a cross-sectional area of each one or at least one of the third grounding lines 303 is equal to a cross-sectional area of each one or at least one of the third signal lines 302. However, the disclosure is not limited to that the line width of the third grounding line must be equal to the line width of the third signal line. As shown in FIG. 2B, the third signal lines 302 and the second signal lines 202 do not overlap one another. That is, an orthogonal projection P3 of each of the third signal lines 302 to the second wiring layer 200 is located between each two adjacent ones of the second signal lines 202, rather than overlapped with each of the second signal lines 202. An orthogonal projection P4 of each of the third signal lines 302 to the first wiring layer 100 overlaps with one of the first signal lines 102.

Each of the semiconductor wiring substrates in the respective embodiments mentioned above is a silicon interposer. In addition, the first layer body, the second layer body and the third layer body are basically made of semiconductor material (for example, silicon or gallium arsenide), however, the disclosure is not limited thereto. The first dielectric layer and the second dielectric layer include materials such as oxides, nitrides, or oxynitrides, however, the disclosure is not limited thereto. The first grounding line, the second grounding line, the third grounding line, the first signal line, the second signal line and the third signal line respectively include a conductive material (for example, metal or indium tin oxide), however, the disclosure is not limited thereto.

Figure 3:
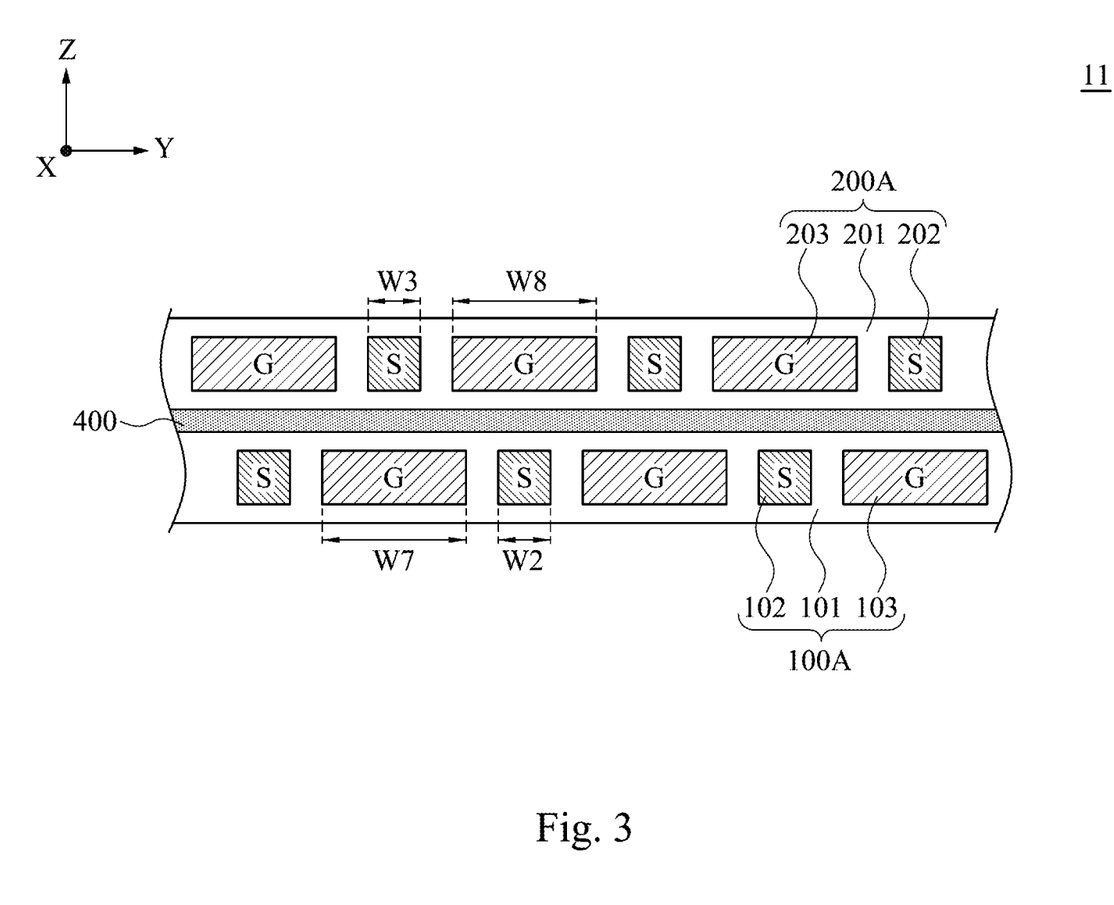
FIG. 3 is a partial schematic view of two of wiring layers of a semiconductor wiring substrate according to one embodiment of the disclosure.

FIG. 3 is a partial schematic view of two of wiring layers of a semiconductor wiring substrate 11 according to one embodiment of the disclosure. As shown in FIG. 3, the semiconductor wiring substrate 11 of FIG. 3 is similar to the semiconductor wiring substrate 10 of FIG. 2A, for example, only single one of the first grounding lines 103 is located between any two adjacent ones of the first signal lines 102 in the same first wiring layer 100A. However, one of the differences between the semiconductor wiring substrate 11 of FIG. 3 and the semiconductor wiring substrate 10 of FIG. 2A is that a line width W7 of each one or at least one of the first grounding lines 103 is greater than a line width W2 of each one or at least one of the first signal lines 102, so as to enhance signal shielding performance. Although the line width W7 above is greater than the line width W2, for example but not be limited thereto, the aforementioned line widths W2, W7 still are in a range of 0.5µ-10µ, respectively. However, the disclosure is not limited that the line width of the first grounding line must be greater than the line width of the first signal line. Furthermore, a cross-sectional area of each one or at least one of the first grounding lines 103 is greater than a cross-sectional area of each one or at least one of the first signal lines 102.

Similarly, only single one of the second grounding lines 203 still is located between any two adjacent ones of the second signal lines 202 in the same second wiring layer 200A. However, another difference between the semiconductor wiring substrate 11 of FIG. 3 and the semiconductor wiring substrate 10 of FIG. 2A is that a line width W8 of each one or at least one of the second grounding lines 203 is greater than a line width W3 of each one or at least one of the second signal lines 202, so as to enhance signal shielding performance. Although the line width W8 above is greater than the line width W3, for example but not be limited thereto, the aforementioned line widths W3, W8 still are in a range of 0.5µ-10µ, respectively. However, the disclosure is not limited that the line width of the second grounding line must be greater than the line width of the second signal line. Furthermore, a cross-sectional area of each one or at least one of the second grounding lines 203 is greater than a cross-sectional area of each one or at least one of the second signal lines 202.

Figure 4:
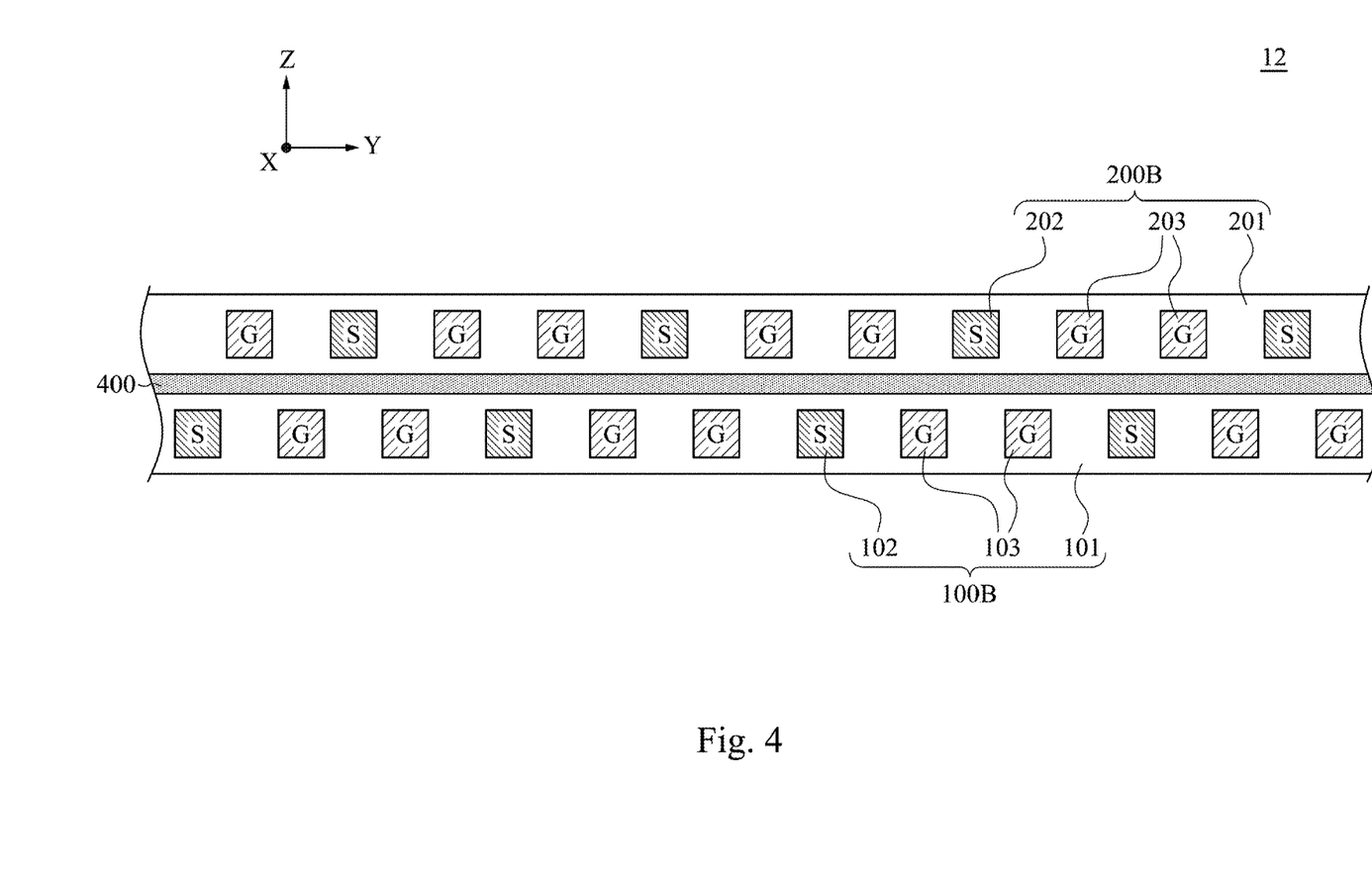
FIG. 4 is a partial schematic view of two of wiring layers of a semiconductor wiring substrate according to one embodiment of the disclosure.

FIG. 4 is a partial schematic view of two of wiring layers of a semiconductor wiring substrate 12 according to one embodiment of the disclosure. As shown in FIG. 4, the semiconductor wiring substrate 12 of FIG. 4 is similar to the semiconductor wiring substrate 10 of FIG. 2A, except that the first signal lines 102 and the first grounding lines 103 are alternately arranged in the first layer body 101 with a quantity correspondingly in a ratio of one to two. That is, two or more of the first grounding lines 103 are located between any two adjacent ones of the first signal lines 102 in the same first wiring layer 100B. Similarly, the second signal lines 202 and the second grounding lines 203 are alternately arranged in the second layer body 201 with a quantity correspondingly in a ratio of one to two. That is, two or more of the second grounding lines 203 are located between any two adjacent ones of the second signal lines 202 in the same second wiring layer 200B.

Figure 5:
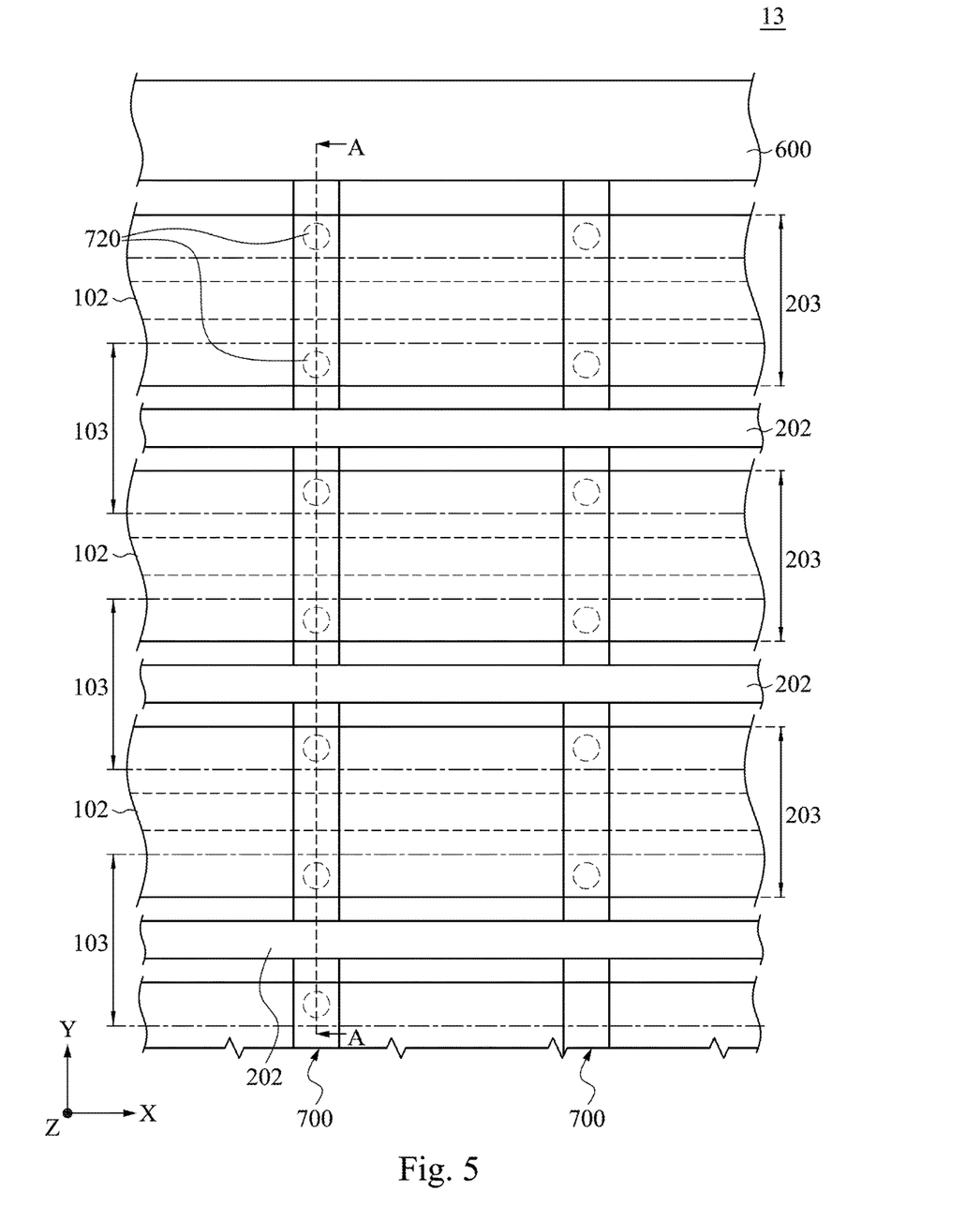
FIG. 5 is a partial top view of one of wiring layers of a semiconductor wiring substrate according to one embodiment of the disclosure.
Figure 6:
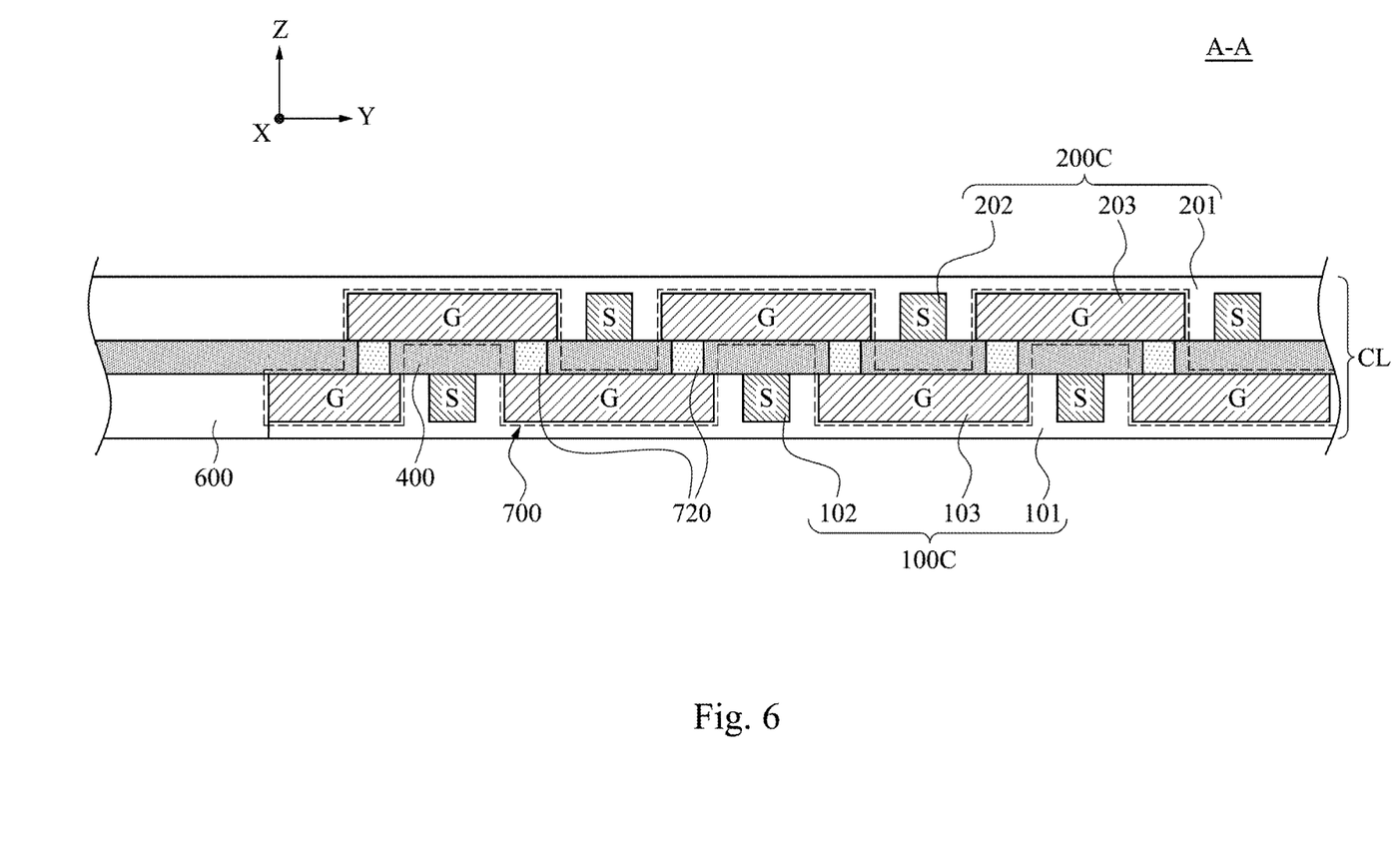
FIG. 6 is a cross sectional view of FIG. 5 viewed along a line A-A.

Reference is now made to FIG. 5 and FIG. 6, in which FIG. 5 is a partial top view of one of wiring layers of a semiconductor wiring substrate 13 according to one embodiment of the disclosure, and FIG. 6 is a cross sectional view of FIG. 5 viewed along a line A-A. As shown in FIG. 5, the semiconductor wiring substrate 13 further includes a plurality of shielding structures 700 and a main grounding area 600. The main grounding area 600 is disposed in the aforementioned multilayer structure M (FIG. 2A), for example, the main grounding area 600 is disposed in the first layer body 101. However, the disclosure is not limited to the location of the main grounding area in the semiconductor wiring substrate. The shielding structures 700 are arranged in parallel with one another in the semiconductor wiring substrate 13. Each of the shielding structures 700 is electrically connected to the main grounding area 600 in Y-axis. The ground stripes, running in y-direction, the signal lines, running in x direction, and the vertical stacking z-direction, are mutually orthogonal or approximately orthogonal to each other.

As shown in FIG. 5 and FIG. 6, each of the shielding structures 700 is shaped as a wave shape, and each of the shielding structures 700 is formed in a combination layer CL (i.e., the range of dashed lines outlining the shield structure 700 in FIG. 6). More specifically, the combination layer is formed by the first wiring layer 100C, the first dielectric layer 400 and the second wiring layer 200C. Each of the shielding structures 700 periodically alternates in the first wiring layer 100C, the first dielectric layer 400 and the second wiring layer 200C. Namely, each of the shielding structures 700 is repeatedly arranged between any two adjacent first signal lines 102 and between any two adjacent second signal lines 202. Each of the first signal lines 102 and the second signal lines 202 are adjacent to each other. Also, each of the shielding structures 700 is integrally connected to all of the first grounding lines 103 and the second grounding lines 203, and electrically connected to the main grounding area 600.

More specifically, each of the shielding structures 700 includes a plurality of conductive through-hole portions 720. Each of the conductive through-hole portions 720 penetrates through the first dielectric layer 400, and each of the conductive through-hole portions 720 is connected to each of the first grounding lines 103 and each of the second grounding lines 203 which are adjacent to each other.

For example, each of the shielding structures 700 is a single conductor (see the range of dashed lines in FIG. 6) which is collectively formed by the first grounding lines 103, the second grounding lines 203 and the aforementioned conductive through-hole portions 720. Because each of the shielding structures 700 is repeatedly arranged any two adjacent first signal lines 102 and between any two adjacent second signal lines 202, each of the shielding structures 700 can lead the electromagnetic noises of all of the first signal lines 102 and the second signal lines 202 to the main grounding area 600 for protecting signals between the first signal lines 102, signals between the second signal lines 202, and signals between the first signal lines 102 and the second signal lines 202 which are adjacent to each other.

Figure 7:
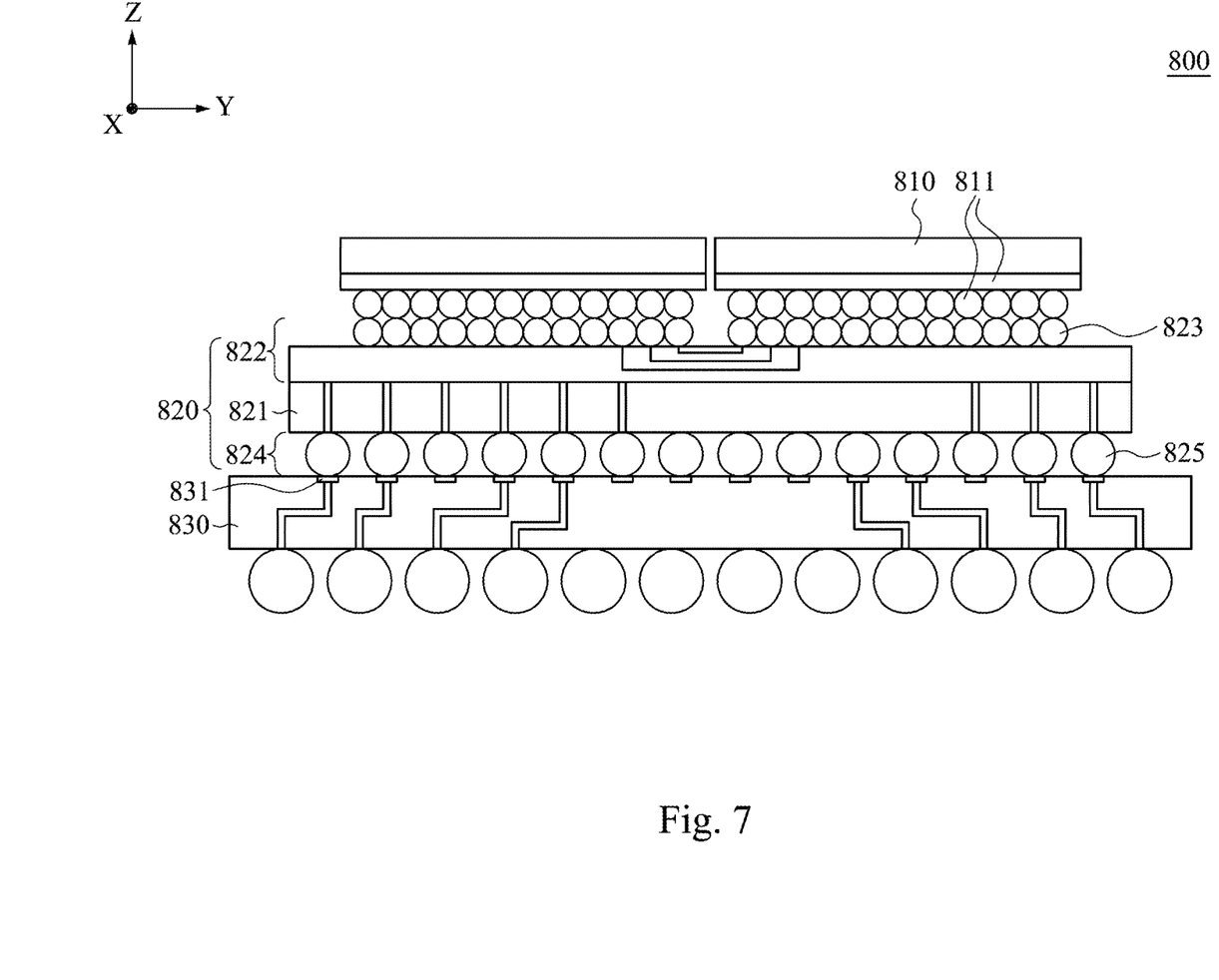
FIG. 7 is a sectional view of a semiconductor package device according to one embodiment of the disclosure.

FIG. 7 is a cross-sectional view of a semiconductor package device 800 according to one embodiment of the disclosure. As shown in FIG. 7, the semiconductor package device 800 includes a plurality semiconductor chips 810, a package substrate 830 and a silicon interposer 820 interposed between the semiconductor chips 810 and the package substrate 830, and electrically connected to the semiconductor chips 810 and the package substrate 830.

Specifically, the silicon interposer 820 includes a semiconductor wiring substrate 821, an upper terminal layer 822 and a lower terminal layer 824. The semiconductor wiring substrate 821 is sandwiched between the upper terminal layer 822 and the lower terminal layer 824. The upper terminal layer 822 includes a plurality of first contacts 823 including soldering pad and balls. The lower terminal layer 824 includes a plurality of second contacts 825 including soldering pad and balls. The semiconductor chip 810 includes a plurality of chip contacts 811 including soldering pad and balls, and the chip contacts 811 are arranged at intervals. The package substrate 830 includes a plurality of substrate contacts 831 including soldering pads, and the substrate contacts 831 are arranged at intervals. The first contacts 823 are soldered to the chip contacts 811, respectively. The second contacts 825 are soldered to the substrate contacts 831, respectively. The semiconductor chips 810 and the semiconductor wiring substrate 821 are not wrapped by any encapsulating material. However, in another embodiment, the semiconductor chips and the semiconductor wiring substrate also can be wrapped together by encapsulating material.

The semiconductor chips 810, for example, can be a volatile memory (e.g., dynamic random access memory, DRAMs) and/or a static random access memory (SRAMs) and/or a nonvolatile memory (e.g., flash memory).

It is noted, although the aforementioned semiconductor wiring substrate in the embodiment is a silicon interposer, however, the disclosure is not limited thereto, in another embodiment, the aforementioned semiconductor wiring substrate also can be other material in the semiconductor package device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:
1. A semiconductor wiring substrate, comprising:
an upper contact layer;
a lower contact layer electrically connected to the upper contact layer;
a first wiring layer disposed between the upper contact layer and the lower contact layer, and electrically connected to the upper contact layer and the lower contact layer, the first wiring layer comprising a plurality of first signal lines and a plurality of first grounding lines which are interleaved and spaced apart in the first wiring layer;

a second wiring layer stacked on one side of the first wiring layer, and the second wiring layer comprising a plurality of second signal lines and a plurality of second grounding lines which are interleaved and spaced apart in the second wiring layer, wherein an orthogonal projection of one of the second signal lines onto the first wiring layer is located between each two adjacent ones of the first signal lines, and does not overlap any of the two adjacent ones of the first signal lines; and a first dielectric layer sandwiched between the first wiring layer and the second wiring layer, and free of the first wiring layer and the second wiring layer.

2. The semiconductor wiring substrate of claim 1, wherein an orthogonal projection of one of the first signal lines to the second wiring layer is located between each two adjacent ones of the second signal lines.

3. The semiconductor wiring substrate of claim 1, wherein at least one of the first grounding lines is located between each two adjacent ones of the first signal lines, and
    at least one of the second grounding lines is located between each two adjacent ones of the second signal lines.

4. The semiconductor wiring substrate of claim 1, wherein the first signal lines and the first grounding lines are alternately arranged in the first wiring layer with a quantity correspondingly in a ratio of one to two, and
    the second signal lines and the second grounding lines are alternately arranged in the second wiring layer with a quantity correspondingly in a ratio of one to two.

5. The semiconductor wiring substrate of claim 1, wherein a line width of at least one of the first grounding lines is not smaller than a line width of at least one of the first signal lines.

6. The semiconductor wiring substrate of claim 1, wherein a gap between each two adjacent ones of the first signal lines is greater than a gap between each of the first signal lines and each of the first grounding lines which are adjacent to each other.

7. The semiconductor wiring substrate of claim 1, further comprising:
    a third wiring layer stacked on one side of the second wiring layer opposite to the first wiring layer, and the third wiring layer comprising a plurality of third signal lines and a plurality of third grounding lines which are interleaved and spaced apart in the third wiring layer,
    wherein an orthogonal projection of one of the third signal lines to the second wiring layer is located between each two adjacent ones of the second signal lines; and an orthogonal projection of one of the third signal lines to the first wiring layer overlaps with one of the first signal lines; and
    a second dielectric layer sandwiched between the second wiring layer and the third wiring layer.

8. The semiconductor wiring substrate of claim 1, further comprising:
    a plurality of conductive through-hole portions spaced to be arranged in the first dielectric layer, each of the conductive through-hole portions penetrating through the first dielectric layer, and connected to each of the first grounding lines and each of the second grounding lines which are adjacent to each other,
    wherein the first grounding lines, the conductive through-hole portions, and the second grounding lines collectively form at least one shielding structure which is located in the first wiring layer, the first dielectric layer and the second wiring layer; and
    a main grounding area disposed between the lower contact layer and the upper contact layer, and electrically connected to the at least one shielding structure.

9. The semiconductor wiring substrate of claim 8, wherein the at least one shielding structure is disposed between each of the first signal lines and each of the second signal lines which are adjacent to each other.

10. The semiconductor wiring substrate of claim 8, wherein a plurality of the at least one shielding structures are arranged in parallel with one another in a combination layer formed by the first wiring layer and the second wiring layer.

11. A semiconductor package device, comprising:
    at least one semiconductor chip;
    a package substrate; and
    an interposer comprising a semiconductor wiring substrate of claim 1 interposed between the at least one semiconductor chip and the package substrate.

12. A semiconductor wiring substrate, comprising:
    a main grounding area;
    a first wiring layer comprising a plurality of first signal lines;
    a second wiring layer stacked on one side of the first wiring layer, comprising a plurality of second signal lines, wherein an orthogonal projection of one of the second signal lines onto the first wiring layer is located between each two adjacent ones of the first signal lines, and does not overlap any of the two adjacent ones of the first signal lines;
    a dielectric layer sandwiched between the first wiring layer and the second wiring layer, and free of the first wiring layer and the second wiring layer; and
    at least one shielding structure shaped as a wave shape, and continually extending to be embedded in the first wiring layer, the dielectric layer and the second wiring layer, electrically connected to the main grounding area, and disposed between one of the first signal lines and one of the second signal lines which are adjacent to each other, and used for shielding signal between the first signal lines and the second signal lines.

13. The semiconductor wiring substrate of claim 12, wherein the shielding structure comprises:
    a plurality of first grounding lines, wherein the first grounding lines and the first signal lines are interleaved and spaced apart in the first wiring layer;
    a plurality of second grounding lines, wherein the second grounding lines and the second signal lines are interleaved and spaced apart in the second wiring layer; and
    a plurality of conductive through-hole portions, each of the conductive through-hole portions penetrates through the dielectric layer, and is connected to each of the first grounding lines and each of the second grounding lines which are adjacent to each other.

14. The semiconductor wiring substrate of claim 13, wherein at least one of the first grounding lines is located between each two adjacent ones of the first signal lines, and
    at least one of the second grounding lines is located between each two adjacent ones of the second signal lines.

15. The semiconductor wiring substrate of claim 13, wherein the first signal lines and the first grounding lines are alternately arranged in the first wiring layer with a quantity correspondingly in a ratio of one to two, and
    the second signal lines and the second grounding lines are alternately arranged in the second wiring layer with a quantity correspondingly in a ratio of one to two.

16. The semiconductor wiring substrate of claim 13, wherein a line width of at least one of the first grounding lines is not smaller than a line width of at least one of the first signal lines; and
   a line width of at least one of the second grounding lines is not smaller than a line width of at least one of the second signal lines.

17. The semiconductor wiring substrate of claim 13, wherein a plurality of the at least one shielding structures are arranged abreast to be paralleled with one another in the first wiring layer, the dielectric layer and the second wiring layer.

18. A semiconductor package device, comprising:
   at least one semiconductor chip;
   a package substrate; and
   an interposer comprising a semiconductor wiring substrate of claim 12 interposed between the at least one semiconductor chip and the package substrate.

* * * * *